United States Patent
Kuroda et al.

[19]
[11] Patent Number: 6,137,713
[45] Date of Patent: Oct. 24, 2000

[54] SEMICONDUCTOR STORAGE DEVICE

[75] Inventors: Naoki Kuroda, Kyoto; Masashi Agata, Osaka; Kazunari Takahashi, Shiga, all of Japan

[73] Assignee: Matsushita Electric Industrial Co., Ltd., Osaka, Japan

[21] Appl. No.: 09/420,576

[22] Filed: Oct. 19, 1999

[30]     Foreign Application Priority Data

Oct. 20, 1998  [JP]  Japan .................................. 10-297737

[51] Int. Cl.[7] .............................. G11C 11/24; G11C 5/02; G11C 5/06
[52] U.S. Cl. ................................ 365/149; 365/51; 365/63
[58] Field of Search ................................ 365/149, 51, 63

[56]           References Cited

U.S. PATENT DOCUMENTS

| | | | |
|---|---|---|---|
| 5,378,906 | 1/1995 | Lee | 257/296 |
| 5,856,940 | 1/1999 | Rao | 365/149 |
| 5,923,593 | 1/1999 | Hsu et al. | 365/149 |

FOREIGN PATENT DOCUMENTS

04238193   8/1992   Japan .

*Primary Examiner*—Trong Phan
*Attorney, Agent, or Firm*—McDermott, Will & Emery

[57]           ABSTRACT

Over an active region with two bent portions on a semiconductor substrate, first and second word lines extend to cross these bent portions and to be vertically spaced apart from each other. Around at the center of the active region, a capacitor for storing data thereon and a capacitor contact are formed. A first bit line contact, which is connected to the active region, is formed on the opposite side to the capacitor contact across the first word line over the active region. A second bit line contact, which is also connected to the active region, is formed on the opposite side to the capacitor contact across the second word line over the active region. These first and second bit line contacts are provided substantially symmetrically about the center of the memory cell. In a pair of memory cells adjacent to each other along bit lines, one vertical end of the active region in one of the memory cells is continuous with an associated vertical end of the active region in the other memory cell. And each of the first and second bit line contacts is shared between an adjacent pair of memory cells.

12 Claims, 12 Drawing Sheets

SEMICONDUCTOR STORAGE DEVICE

BACKGROUND OF THE INVENTION

The present invention generally relates to a semiconductor storage device such as a dynamic random access memory (DRAM), and more particularly relates a semiconductor storage device with a plurality of memory cells, each including two transistors and a single capacitor. In this specification, a memory cell of this type will be called a "two-transistor/one-capacitor memory cell".

A memory cell widely used as an elementary unit for a semiconductor storage device like a DRAM is a "one-transistor/one-capacitor memory cell" including just one switching transistor and only one capacitor. This is an inevitable consequence of downsizing of memory cells, or reduction in number of components included in a single memory cell. To further downsize the one-transistor/one-capacitor memory cell, various techniques of modifying the shape of, or miniaturizing the size of, a memory cell while ensuring sufficient storage capacity have already been put into practice.

Figure 12:
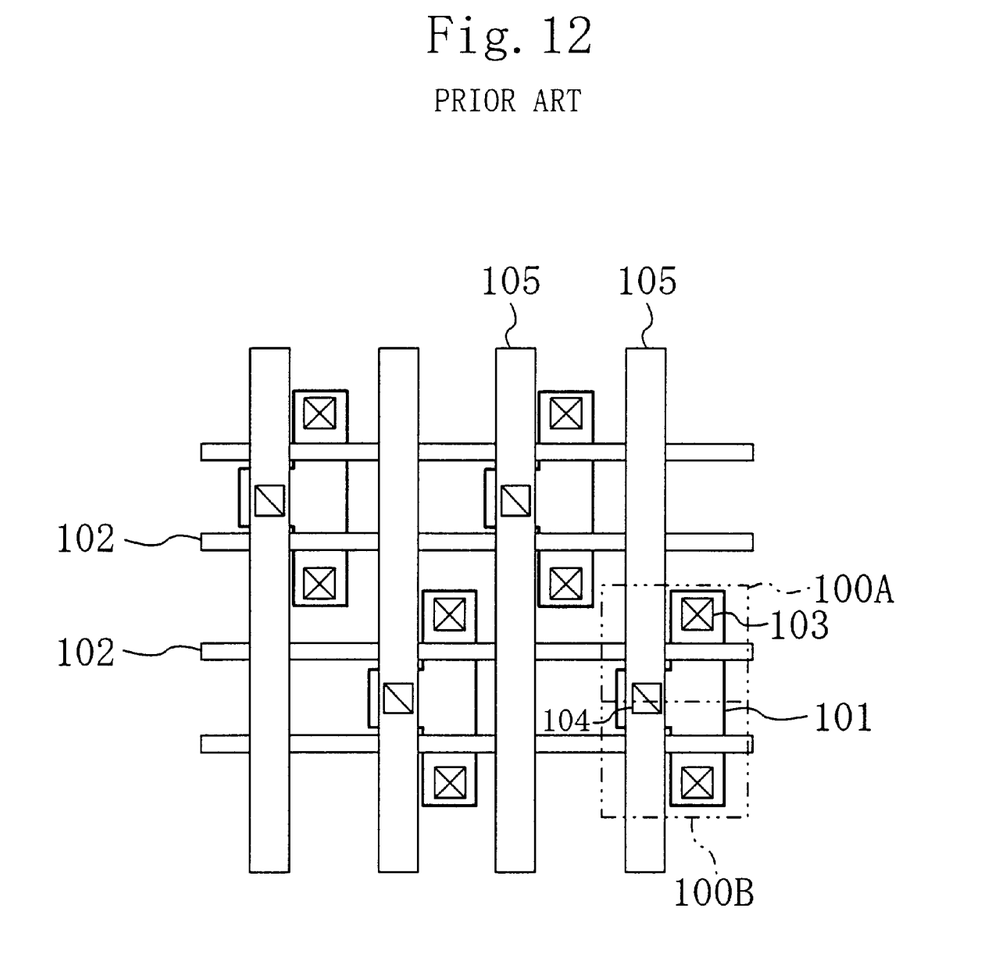
FIG. 12 is a plan view illustrating conventional one-transistor/one-capacitor memory cells.

Hereinafter, a conventional one-transistor/one-capacitor memory cell will be described with reference to FIG. 12. FIG. 12 illustrates a planar layout for conventional memory cells. As shown in FIG. 12, a plurality of mutually adjacent memory cells 100A, 100B are arranged on a substrate to form a regular pattern. In the memory cell 100A, for example, an active region 101 is formed out of a diffused layer for a switching transistor. Over the active region 101, a word line 102 is formed as a gate electrode for controlling the switching transistor.

A capacitor (not shown) is formed over the active region 101 on the opposite side to the memory cell 100B across the word line 102. Under the capacitor, a capacitor contact 103 for electrically connecting the storage node of the capacitor to the active region 101 is formed.

Over the active region 101, a bit line contact 104 is also provided in an extended region on the opposite side to the capacitor contact 103 across the word line 102. And a bit line 105 for reading and writing data from/onto the capacitor is formed over a substrate so as to be connected to the bit line contact 104 and to cross the word lines 102.

As can be seen, the conventional one-transistor/one-capacitor memory cells have its planar layout optimized so as to downsize the memory cells 100A and 100B by minimizing the line pitch between adjacent bit lines 105 or word lines 102 and yet to attain sufficient storage capacity.

An integrated circuit has never been implemented using the two-transistor/one-capacitor memory cells, which are the target of the present invention. If the conventional one-transistor/one-capacitor memory cells are simply combined to implement this scheme, then each two-transistor/one-capacitor memory cell requires an area almost four times as large as the conventional memory cell, thus tremendously increasing the area of a chip occupied by the memory cells.

In the two-transistor/one-capacitor memory cell, two switching transistors are commonly connected to a single capacitor for storing data thereon. Accordingly, if one of these switching transistors is dedicated to writing while the other to reading, then the operation cycle can be doubled without changing the frequency of operation clock signals. Thus, the two-transistor/one-capacitor memory cell can easily contribute to high-speed operation in such a case.

SUMMARY OF THE INVENTION

A first object of the present invention is integrating as large a number of two-transistor/one-capacitor memory cells as possible within a given area on a chip.

A second object of the present invention is reducing interference noise between bit lines even when a great number of two-transistor/one-capacitor memory cells are integrated within a narrow area.

A first exemplary semiconductor storage device according to the present invention accomplishes the first object. The first semiconductor storage device includes a plurality of memory cells, each consisting of first and second switching transistors and a capacitor. The first and second transistors share a portion of an active region on a substrate. The capacitor is formed over the shared portion and has a storage node for storing data thereon. Each said memory cell is associated with: a first word line extending over the first switching transistor and functioning as a gate electrode in a first region of the shared portion over the active region; a second word line extending over the second switching transistor and functioning as a gate electrode in a second region of the shared portion over the active region; a capacitor contact being formed between the shared portion and the storage node and electrically connecting the shared portion to the storage node; a first bit line contact being formed over the first switching transistor on the opposite side to the capacitor contact across the first word line and being electrically connected to the first region; a second bit line contact being formed over the second switching transistor on the opposite side to the capacitor contact across the second word line and being electrically connected to the second region; a first bit line being formed over, and electrically connected to, the first bit line contact and extending to cross the first and second word lines; and a second bit line being formed over, and electrically connected to, the second bit line contact and extending to cross the first and second word lines. The first and second bit line contacts are provided substantially symmetrically about the center of each said memory cell. In two of the memory cells that are adjacent to each other in a direction parallel to the bit lines, one end of the active region in one of the memory cells is continuous with an associated end of the active region in the other memory cell. Each of the first and second bit line contacts is shared between the adjacent pair of memory cells.

In the first semiconductor storage device, taking two of the memory cells that are adjacent to each other along the bit lines, one end of the active region in one of the memory cells is continuous with an associated end of the active region in the other memory cell. In contrast, in a conventional semiconductor storage device formed through various fabrication process steps, adjacent active regions are often isolated from each other. Thus, according to the present invention, the active regions can be formed in a desired shape more easily. Also, since each of the first and second bit line contacts is shared between the adjacent pair of memory cells according to the present invention, the number of bit line contacts can be halved. As a result, the area occupied by the cells can be considerably cut down.

In one embodiment of the present invention, each of the first and second word lines preferably has a pair of bent portions, which are located on right and left sides of an intersection between the first or second word line and the first or second bit line. In such an embodiment, if the bent portions are bent inward, i.e., toward the center of a memory cell, and if the bit line contact is formed between the bent portions, then the distance between the bit line contact and the capacitor contact can be shortened. As a result, the size of the memory cell can be reduced vertically along the bit lines.

In another embodiment, each of the gate electrodes of the first and second switching transistors is preferably formed only in a portion of the active region, which overlaps with either the first or second bit line. In such an embodiment, the line pitch between the first and second bit lines can be reduced irrespective of the channel width of the respective switching transistors. As a result, the size of the memory cell can be reduced in the direction parallel to the word lines.

In still another embodiment, the active regions of the first and second switching transistors are preferably provided within a substrate plane to cross the first and second word lines and the first and second bit lines. In such an embodiment, the active region can be smaller in area than an active region with a planar crank shape. As a result, a layout of a higher density is realized.

In still another embodiment, the active regions of the first and second switching transistors are preferably both provided between the first and second bit lines. In each said memory cell, the device preferably further includes: a first bit auxiliary line, which is provided between the first bit line and the first bit line contact for electrically connecting the first bit line to the first bit line contact; and a second bit auxiliary line, which is provided between the second bit line and the second bit line contact for electrically connecting the second bit line to the second bit line contact. In such an embodiment, the first and second bit line contacts and the capacitor contact are arranged substantially in line. As a result, the memory cell can be considerably downsized along the word lines.

In this particular embodiment, in two of the memory cells that are adjacent to each other in a direction parallel to the bit lines, the active region of the first switching transistor in one of the memory cells is preferably continuous with the active region of the first switching transistor in the other memory cell. Or the active region of the second switching transistor in one of the memory cells is preferably continuous with the active region of the second switching transistor in the other memory cell. Each of the first and second bit line contacts is preferably shared between the adjacent pair of memory cells. In such an embodiment, the active regions can be formed continuously and can be fabricated in its desired shape more easily. Also, since each of the bit line contacts is shared between adjacent memory cells, the number of bit line contacts can be halved, thus contributing to further downsizing.

In an alternate embodiment, each of the first and second bit lines is preferably formed out of two interconnection layers stacked one upon the other. In such an embodiment, there is no need to secure a margin for a region of isolating adjacent bit lines from each other. As a result, a memory cell can be downsized considerably.

In this particular embodiment, the two interconnection layers preferably cross each other over the memory cells. In such an embodiment, the parasitic capacitance between bit lines can be reduced compared to parallel disposition of bit lines. As a result, interference noise between bit lines can be reduced and the second object of the present invention is achieved.

In this particular embodiment, each of the first and second bit lines preferably includes higher- and lower-level interconnection lines that are electrically connected to each other via interconnection contacts. The higher- and lower-level interconnection lines alternately interchange their levels between adjacent ones of the memory cells. In such an embodiment, the bit lines can be disposed uniformly both within the planes parallel to the surface of the substrate and within the planes vertical thereto, and therefore the material for the bit lines can be evenly distributed. As a result, the performance of memory cells can also be uniformized.

A second exemplary semiconductor storage device according to the present invention accomplishes the first object. The storage device includes: a first switching transistor formed in a first active region on a substrate; a first word line extending over the first active region and functioning as a gate electrode over the first active region; a capacitor for storing data thereon, the capacitor being formed in a first region beside the first word line over the first active region; a first bit line contact being formed in a second region beside the first word line over the first active region and being electrically connected to the first active region, the second region being located on the opposite side to the first region across the first word line; a second switching transistor formed in a second active region on the substrate, the second active region being located on the same side as the capacitor beside the first word line and being spaced apart from the first active region; a second word line being formed over the second active region to be spaced apart from the first word line and functioning as a second gate electrode over the second active region; and a second bit line contact being formed beside the second word line over the second active region and being electrically connected to the second active region, the second bit line contact being formed on the opposite side to the capacitor across the second word line. The capacitor includes a storage node for electrically connecting the first and second active region together in a region interposed between the first and second word lines.

In the second semiconductor storage device, the first and second active regions are provided on the substrate for the first and second switching transistors, respectively, so as to be spaced apart from each other. The capacitor is formed in a region interposed between the first and second word lines in the first and second active regions. And the capacitor includes a storage node for electrically connecting the first and second active region together in the region between the first and second word lines. Accordingly, a layout for a two-transistor/one-capacitor memory cell can be obtained easily without changing a layout for a one-transistor/one-capacitor memory cell. That is to say, the conventional fabrication process may be utilized almost as it is, thus considerably reducing the fabrication cost.

DESCRIPTION OF THE PREFERRED EMBODIMENTS

EMBODIMENT 1

Hereinafter, a first embodiment of the present invention will be described with reference to the accompanying drawings.

Figure 1:
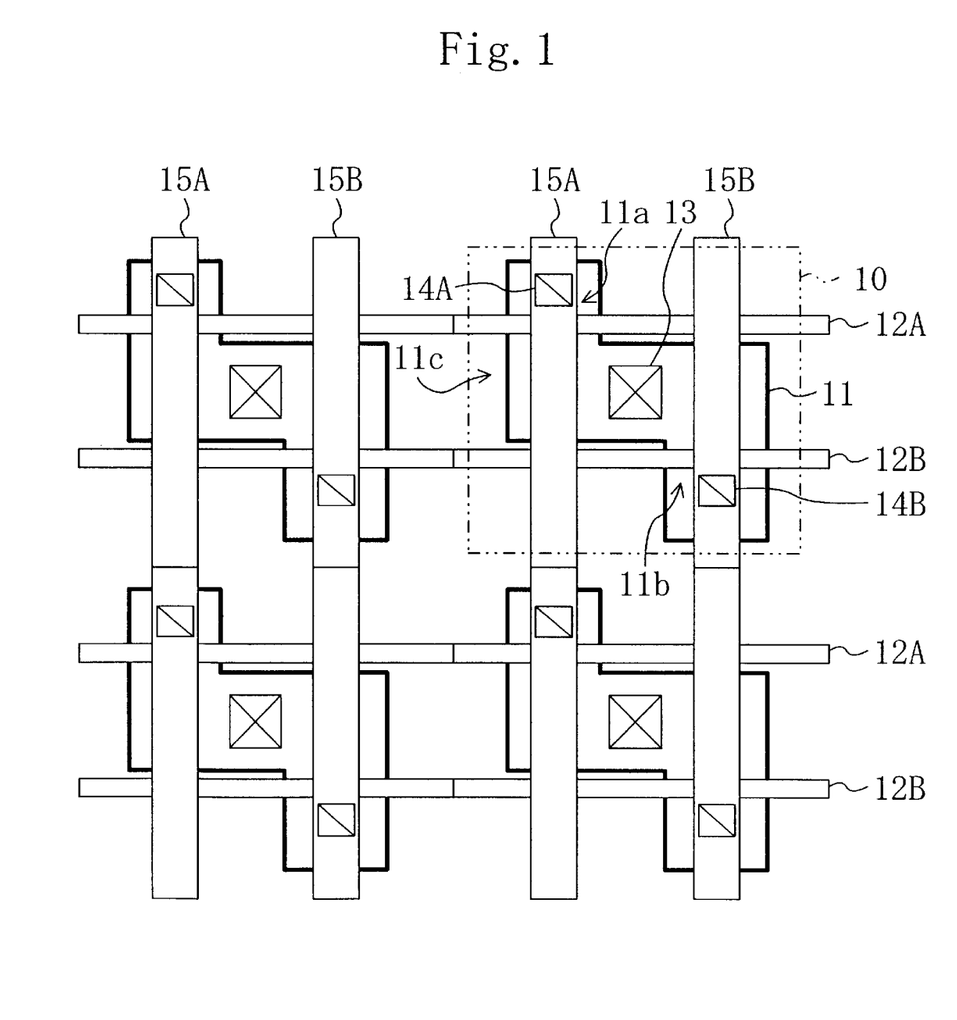
FIG. 1 is a plan view illustrating part of a semiconductor storage device according to a first embodiment of the present invention.

FIG. 1 illustrates a partial planar layout for a semiconductor storage device according to the first embodiment. As shown in FIG. 1, a plurality of memory cells 10 are arranged on a semiconductor substrate. In each of these memory cells, an active region 11 is formed out of a diffused layer in the shape of a crank as viewed from above. The active region 11 includes two bent portions, which extend from the center of the memory cell 10 in mutually opposite directions. Over the active region 11, first and second word lines 12A and 12B extend to cross these bent portions and to be vertically spaced apart from each other. The first word line 12A functions as a gate electrode for controlling a first switching transistor 11a over the active region 11, while the second word line 12B functions as a gate electrode for controlling a second switching transistor 11b over the active region 11. That is to say, a portion of the active region 11 interposed between these gate electrodes is a shared portion 11c.

Around at the center of the shared portion 11c, not only a capacitor (not shown) for storing data thereon, but also a capacitor contact 13 for electrically connecting the storage node of the capacitor to the upper surface of the active region 11 are formed.

A first bit line contact 14A, which is electrically connected to the upper surface of the active region 11, is formed on the opposite side to the capacitor contact 13 across the first word line 12A over the active region 11. A second bit line contact 14B, which is also electrically connected to the upper surface of the active region 11, is formed on the opposite side to the capacitor contact 13 across the second word line 12B over the active region 11.

A first bit line 15A for reading/writing data from/onto the capacitor is formed on, and electrically connected to, the first bit line contact 14A to extend over and cross the first word line 12A. A second bit line 15B for reading/writing data from/onto the capacitor is formed on, and electrically connected to, the second bit line contact 14B to extend over and cross the second word line 12B. The second bit line 15B is horizontally spaced apart from the first bit line 15A. The respective contacts 13, 14A and 14B are actually covered with, and hidden behind, associated members formed thereon. In all the drawings including FIG. 1, however, these contacts are illustrated with solid lines for convenience sake, i.e., to definitely indicate their locations.

Figure 2:
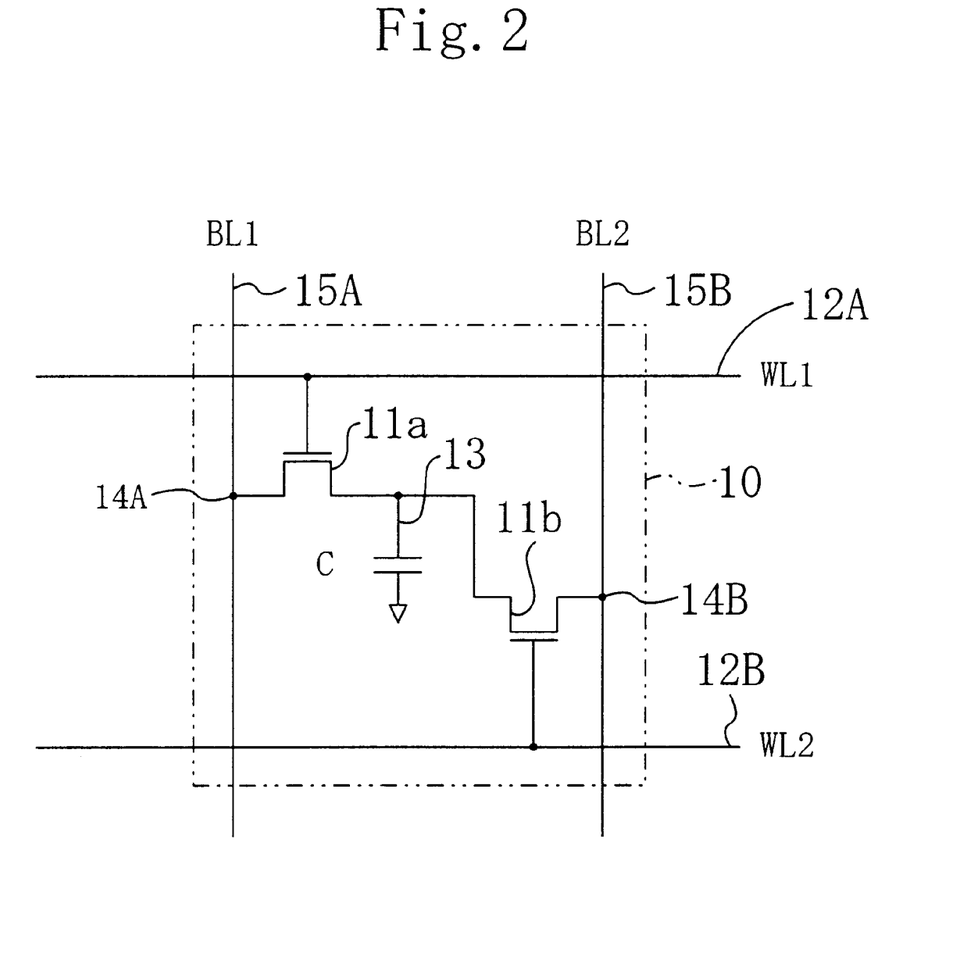
FIG. 2 is a circuit diagram of a semiconductor storage device according to the present invention.

FIG. 2 illustrates a circuit configuration of the two-transistor/one-capacitor memory cell according to the present invention. In FIG. 2, components corresponding to those illustrated in FIG. 1 are identified by the same reference numerals and the description thereof will be omitted herein. It should be noted that the circuit configuration shown in FIG. 2 is applicable to respective semiconductor storage devices according to the other embodiments.

Figure 3:
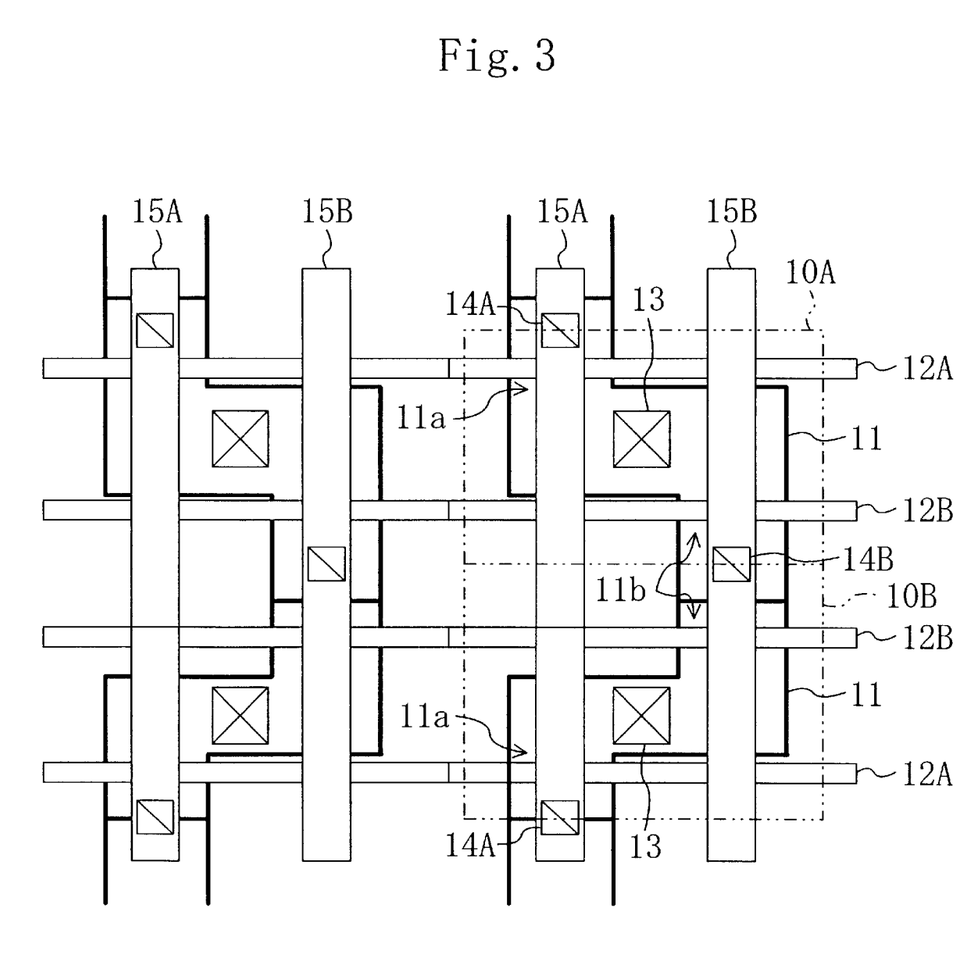
FIG. 3 is a plan view illustrating part of a semiconductor storage device according to a second embodiment of the present invention.

As shown in FIG. 3, since the active regions 11 of the switching transistors 11a and 11b, i.e., source regions, are shared, the capacitor contact 13 can also be shared. In other words, only one capacitor contact 13 should be provided for the memory cell 10, thus reducing the occupied area per memory cell 10.

Also, the first and second bit line contacts 14A and 14B are disposed substantially symmetrically about the center of the memory cell 10. And the capacitor contact 13 is located around at the center of the shared portion 11c within the active region 11 surrounded by the first and second word lines 12A and 12B and the first and second bit lines 15A and 15B. Accordingly, the line pitch between the word lines 12A and 12B and that between the bit lines 15A and 15B can be both reduced, thus further downsizing the memory cell 10.

In addition, in view of the symmetrical shape of the active region 11, symmetrical disposition of the bit line contacts 14A and 14B and location of the capacitor contact 13, the two switching transistors of the memory cell 10 can also be formed in a symmetrical shape. As a result, the performance of the memory cell 10 itself can also be uniformized.

In the illustrated embodiment, the active region 11 is formed like a crank in its planar layout. Alternatively, the active region 11 may be formed in any arbitrary symmetrical shape.

EMBODIMENT 2

Next, a second embodiment of the present invention will be described with reference to FIG. 3.

FIG. 3 illustrates a partial planar layout for a semiconductor storage device according to the second embodiment. In FIG. 3, the same components as those illustrated in FIG. 1 are identified by the same reference numerals and the description thereof will be omitted herein.

In the second embodiment, a first memory cell 10A with the same configuration as the memory cell 10 of the first embodiment is vertically continuous with a second memory cell 10B adjacent to the first memory cell 10A in the direction in which the bit lines 15A and 15B extend. These memory cells 10A and 10B are used as a unit cell during placement.

The second memory cell 10B includes a crank-shaped active region 11, which is obtained by rotating the active region 11 of the first memory cell 10A by 180 degrees about a centerline parallel to the first word line 12A.

Thus, as shown in FIG. 3, the diffused layer for the second switching transistor 11b of the first memory cell 10A can be formed continuously with that for the second switching transistor 11b of the second memory cell 10B. During a fabrication process, an isolated pattern, in which active regions 11 are isolated from each other, is more likely to deform than a continuous pattern. In contrast, the continuous pattern can be formed in its desired shape more easily. In addition, the second bit line contact 14B can be shared between adjacent second switching transistors 11b of the first and second memory cells 10A and 10B. Accordingly, the total number of bit line contacts can be halved. In the same way, the first bit line contact 14A can also be shared between first switching transistors 11a adjacent to each other along the bit lines. Thus, the area occupied by the pair of memory cells 10A and 10B can be further reduced by about 10 to about 20%.

EMBODIMENT 3

Next, a third embodiment of the present invention will described with reference to FIG. 4.

Figure 4:
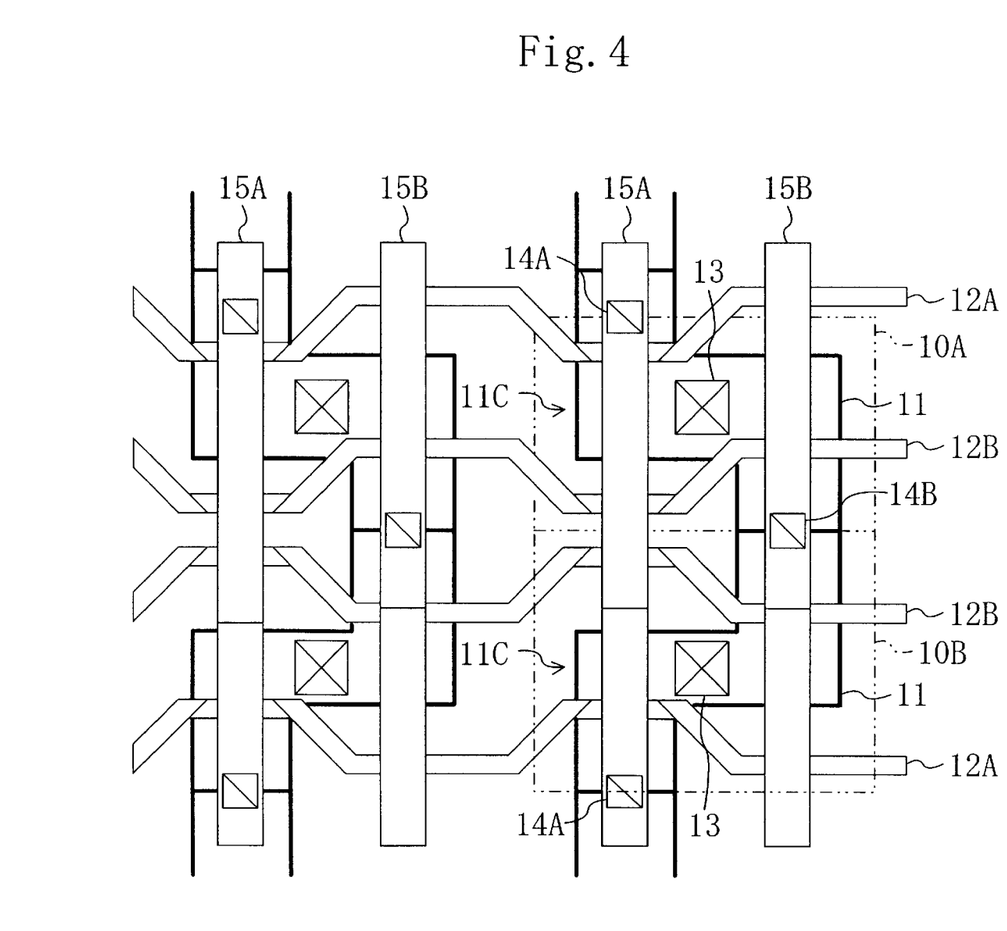
FIG. 4 is a plan view illustrating part of a semiconductor storage device according to a third embodiment of the present invention.

FIG. 4 illustrates a partial planar layout for a semiconductor storage device according to the third embodiment. In FIG. 4, the same components as those illustrated in FIG. 3 are identified by the same reference numerals and the description thereof will be omitted herein.

In the third embodiment, respective parts of the first and second word lines 12A and 12B are bent in predetermined directions over the active regions 11. That is to say, the locations of the gate electrodes are displaced toward the lateral centerline of a unit cell inside the memory cells 10A and 10B. For example, to attain a predetermined gate width, the first word line 12A is bent to go away from the capacitor contact 13 as the lateral distance between first word line 12A and the first bit line 15A increases. In the same way, to attain a predetermined gate width, the second word line 12B is also bent to go away from the capacitor contact 13 as the lateral distance between second word line 12B and the second bit line 15B increases. Even in this embodiment, the line pitch between the first and second word lines 12A and 12B is kept constant.

As can be seen, since the first word line 12A is bent toward the capacitor contact 13 according to this embodiment, the distance between the capacitor contact 13 and the first bit line contact 14A can be shortened. Accordingly, the area of an isolating region, which is located inside a U-shaped active region formed by connecting the active regions 11 of the first and second memory cells 10A and 10B together, can be reduced. Thus, the memory cells can be further downsized vertically, i.e., along the bit lines.

According to the third embodiment, the word lines 12A and 12B are partially bent to reduce the size of memory cells vertically. The same statement is also applicable to the bit lines 15A and 15B. That is to say, the active regions 11 may be compressed along the word lines and the bit lines 15A and 15B may be partially bent to go away from the capacitor contacts 13.

EMBODIMENT 4

Next, a fourth embodiment of the present invention will be described with reference to FIG. 5.

Figure 5:
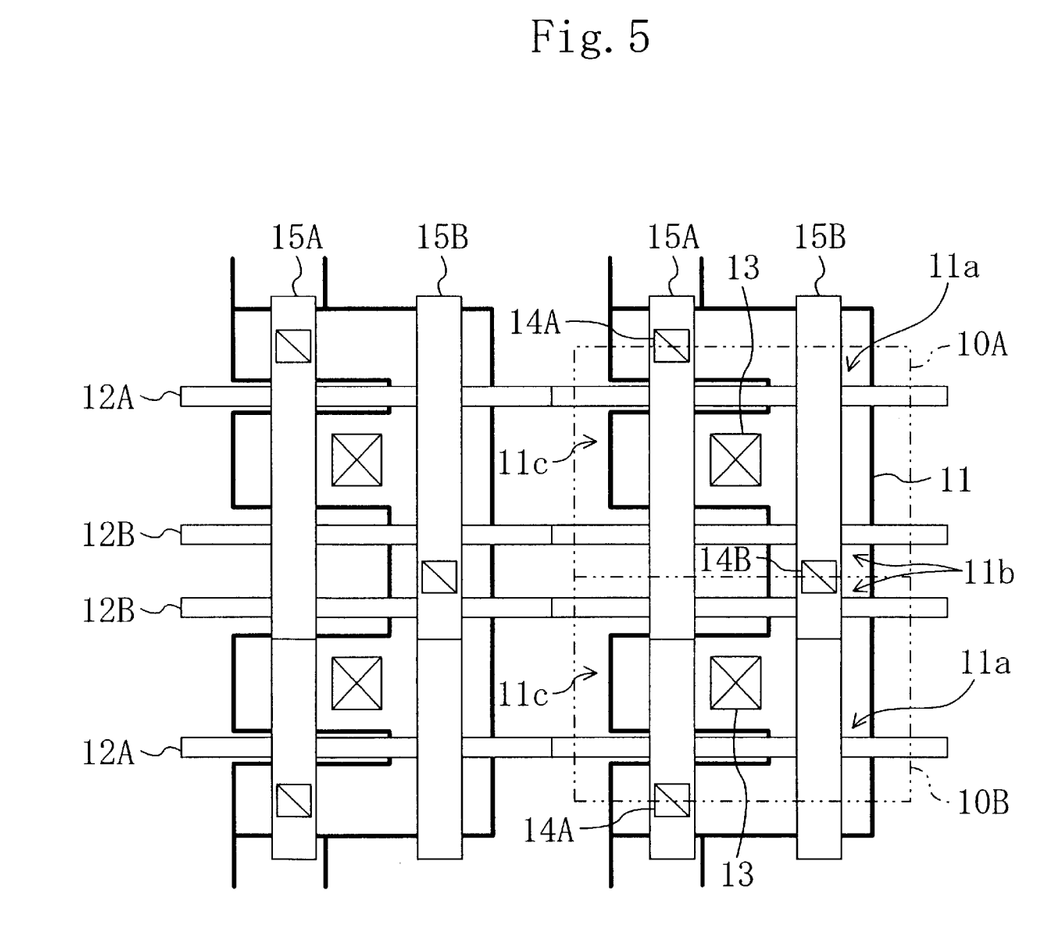
FIG. 5 is a plan view illustrating part of a semiconductor storage device according to a fourth embodiment of the present invention.

FIG. 5 illustrates a partial planar layout for a semiconductor storage device according to the fourth embodiment. In FIG. 5, the same components as those illustrated in FIG. 3 are identified by the same reference numerals and the description thereof will be omitted herein.

As shown in FIG. 5, the active region 11 is formed in the shape of a crook with an extending portion, which functions as the shared portion 11c between the first and second word lines 12A and 12B. Thus, the gate electrodes of the first and second switching transistors 11a and 11b are provided in only the portions of the first and second word lines 12A and 12B overlapping with the second bit line 15B over the active region 11. In this embodiment, the capacitor contact 13 is also formed around at the center of the shared portion 11c in each of the memory cells 10A and 10B. And the first and second bit line contacts 14A and 14B are also disposed substantially symmetrically about the center of each memory cell 10A or 10B.

According to this embodiment, a channel width required for each of the switching transistors 11a and 11b to attain a predetermined ability can be no greater than the line pitch of the second bit line 15B. As a result, the line pitch between the first and second bit lines 15A and 15B can be reduced irrespective of the channel widths of the switching transistors 11a and 11b. Thus, this embodiment is applicable particularly effectively to a situation where the sizes of the memory cells 10A and 10B are restricted by the channel widths of the switching transistors 11a and 11b.

The planar shape of the active region 11 is not limited to that illustrated in FIG. 5. Alternatively, any arbitrary shape may be selected so long as the conditions of this embodiment are met, i.e., if the channel width is determined only by the word line overlapping with the first or second bit line 15A or 15B over the active region 11.

Also, the active regions 11 of the memory cells 10A and 10B adjacent to each other along the bit lines do not have to be symmetrical as in the embodiment shown in FIG. 5.

EMBODIMENT 5

Next, a fifth embodiment of the present invention will be described with reference to FIG. 6.

Figure 6:
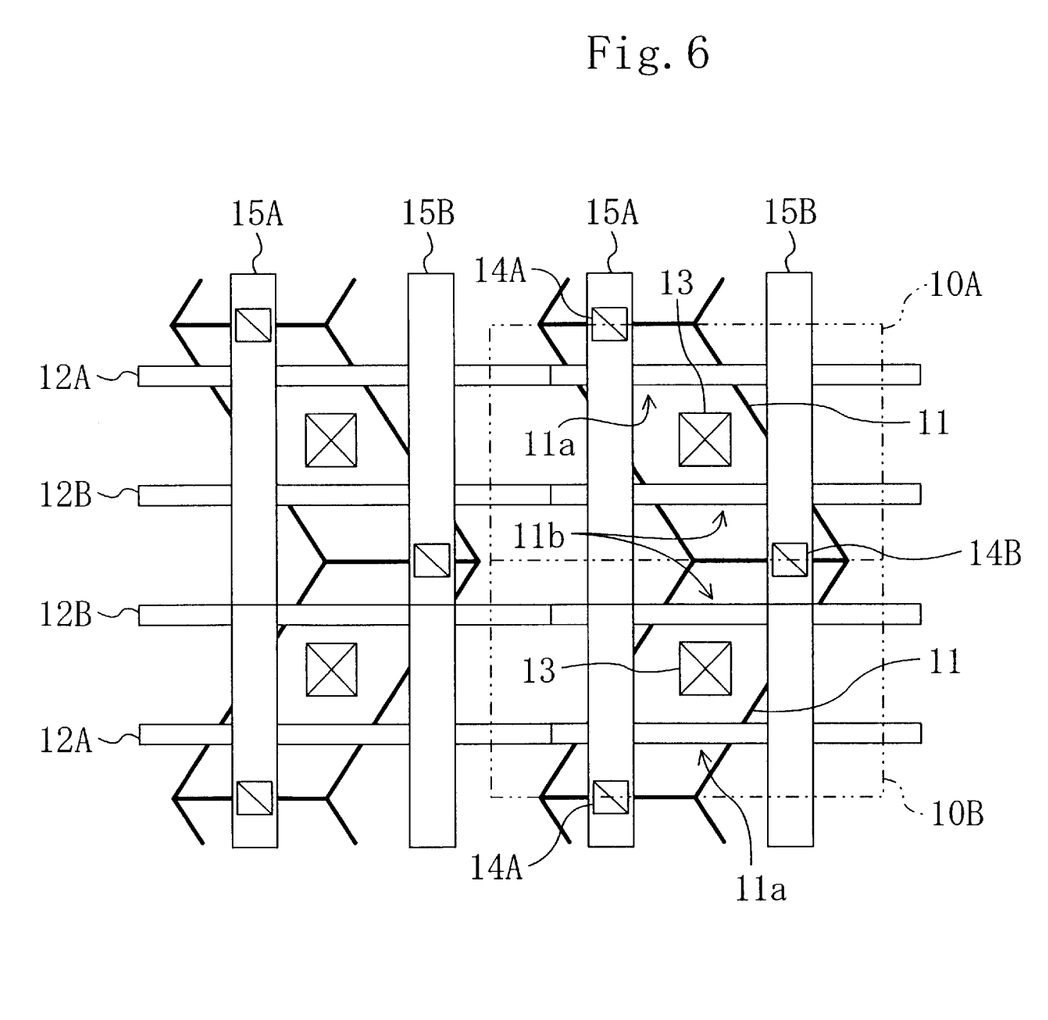
FIG. 6 is a plan view illustrating part of a semiconductor storage device according to a fifth embodiment of the present invention.

FIG. 6 illustrates a partial planar layout for a semiconductor storage device according to the fifth embodiment. In FIG. 6, the same components as those illustrated in FIG. 3 are identified by the same reference numerals and the description thereof will be omitted herein.

In the fifth embodiment, each active region 11 is provided almost diagonally within a rectangular memory cell 10A or 10B. Specifically, the active region 11 is formed to cross the first and second word lines 12A and 12B and the first and second bit lines 15A and 15B within the memory cell 10A or 10B.

In such an embodiment, the active region 11 can be smaller in area than the counterpart of the second or fourth embodiment, thus realizing a denser layout.

EMBODIMENT 6

Next, a sixth embodiment of the present invention will be described with reference to FIG. 7.

Figure 7:
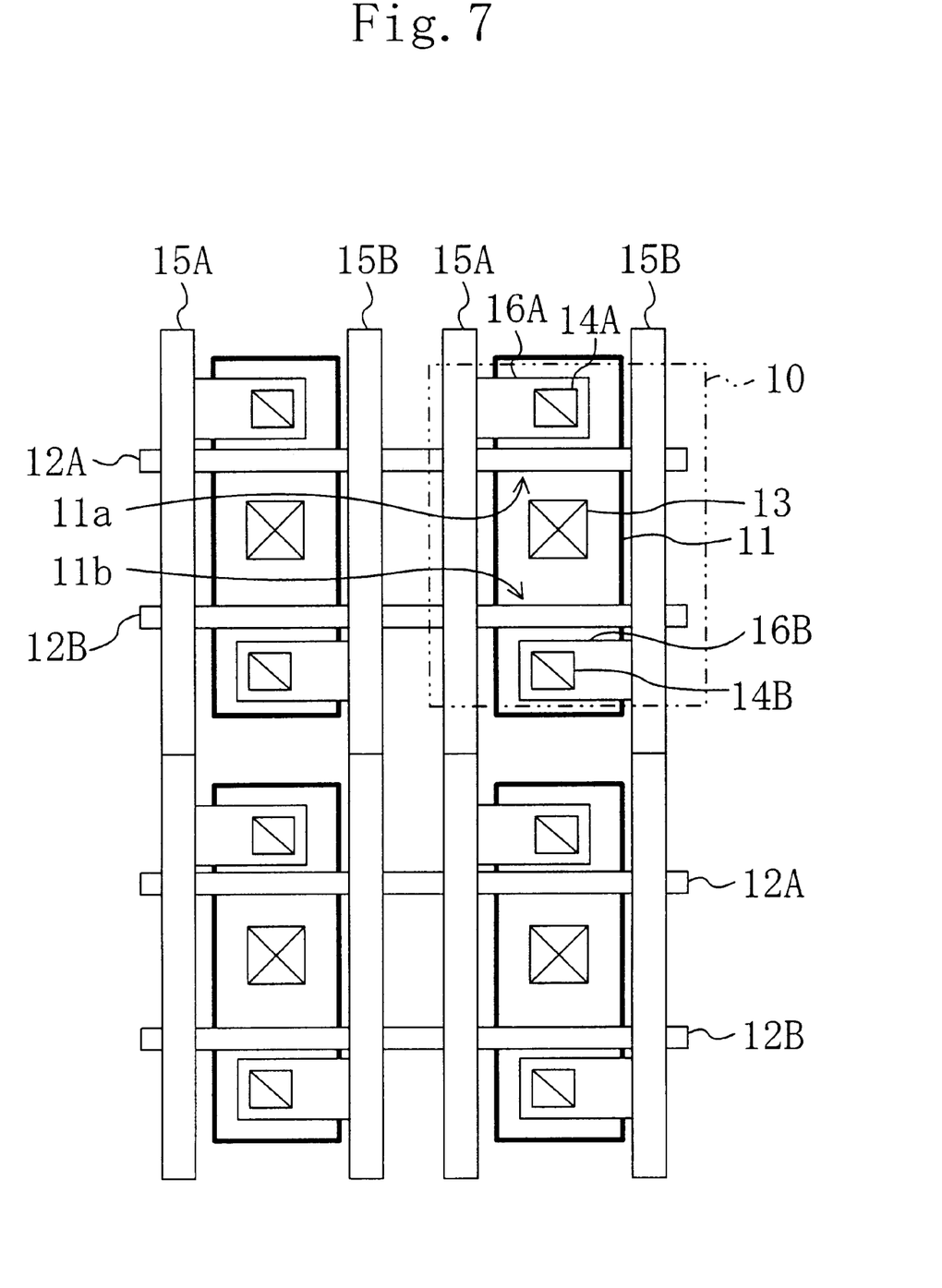
FIG. 7 is a plan view illustrating part of a semiconductor storage device according to a sixth embodiment of the present invention.

FIG. 7 illustrates a partial planar layout for a semiconductor storage device according to the sixth embodiment. In FIG. 7, the same components as those illustrated in FIG. 1 are identified by the same reference numerals and the description thereof will be omitted herein.

As shown in FIG. 7, the active region 11 according to the sixth embodiment is rectangular and interposed between the first and second bit lines 15A and 15B. A first bit auxiliary line 16A is provided between the first bit line contact 14A and the first bit line 15A for electrically connecting the first bit line contact 14A to the first bit line 15A. A second bit auxiliary line 16B is provided between the second bit line contact 14B and the second bit line 15B for electrically connecting the second bit line contact 14B to the second bit line 15B. In this configuration, the first and second bit line contacts 14A and 14B and the capacitor contact 13 can be arranged substantially in line. Thus, the memory cell 10 can be downsized horizontally, i.e., along the word lines.

Furthermore, the active region 11 may be of a minimum size required for the switching transistors 11a and 11b. Thus, if the abilities of the transistors 11a and 11b are restricted by the area of the active region 11, the area of the active region 11 can be optimized.

In the foregoing second, third and fourth embodiments, the active regions are bent and therefore extra areas are occupied around the active regions. In contrast, according to the sixth embodiment, such extra areas can be cut down.

In addition, since the shape of the active region 11 is simplified, the active region 11 can be formed in its desired shape easily during the fabrication process.

In the illustrated embodiment, the bit line contacts 14A and 14B and capacitor contact 13 are arranged in line along the bit lines. However, these contacts do not have to be arranged in line. Also, the bit lines 15A and 15B are linear in the illustrated embodiment. Alternatively, these bit lines 15A and 15B may be bent to adjust the line pitch.

EMBODIMENT 7

Next, a seventh embodiment of the present invention will be described with reference to FIG. 8.

Figure 8:
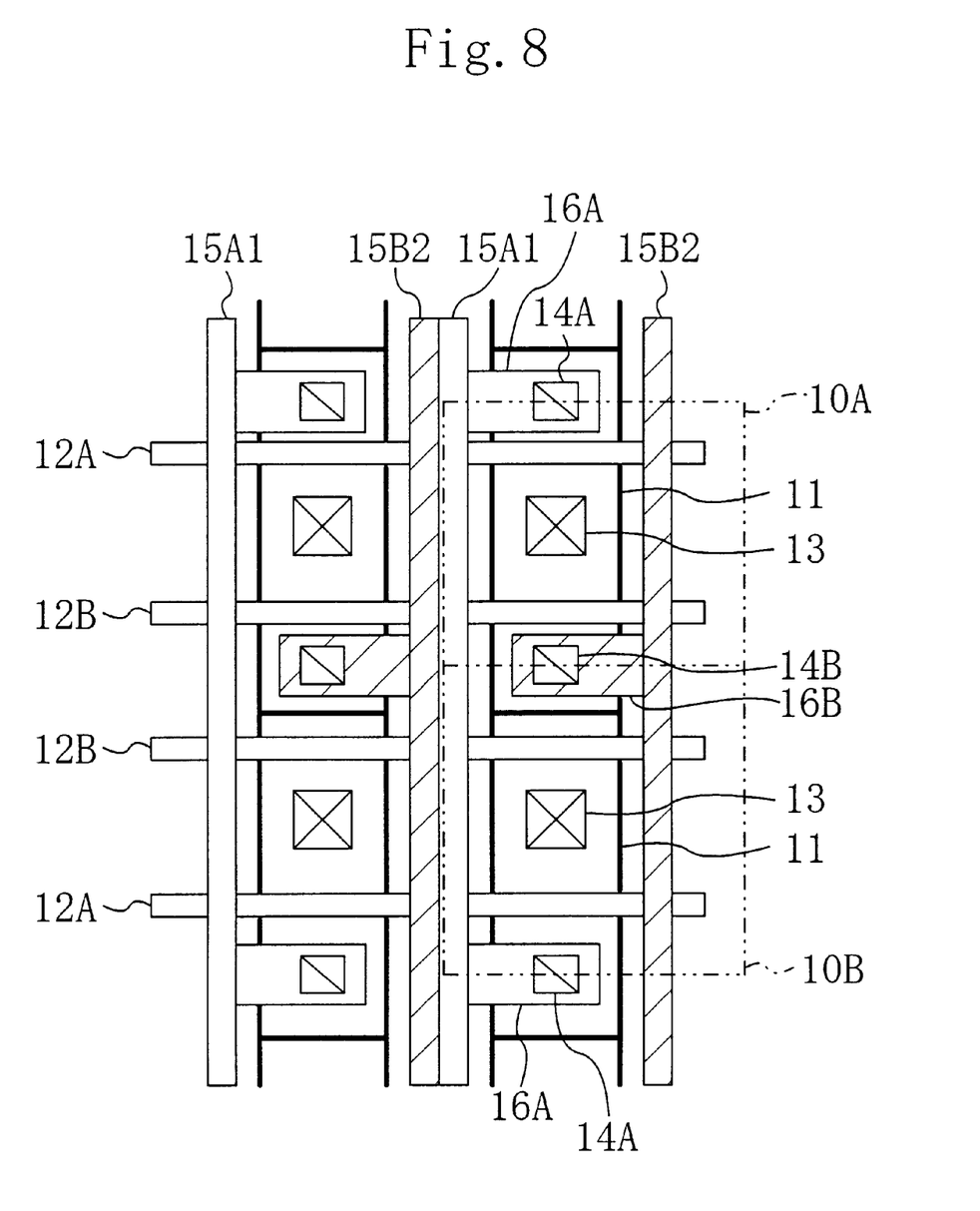
FIG. 8 is a plan view illustrating part of a semiconductor storage device according to a seventh embodiment of the present invention.

FIG. 8 illustrates a partial planar layout for a semiconductor storage device according to the seventh embodiment.

In FIG. 8, the same components as those illustrated in FIG. 7 are identified by the same reference numerals and the description thereof will be omitted herein.

In the seventh embodiment, the active region 11 of a first memory cell 10A with the same configuration as the memory cell 10 of the sixth embodiment is vertically continuous with that of a second memory cell 10B adjacent to the first memory cell 10A along the bit lines. These memory cells 10A and 10B are used as a unit cell during placement.

The second memory cell 10B includes a rectangular active region 11. The second bit line contact 14B is shared between the first and second memory cells 10A and 10B by placing the second word line 12B of the second memory cell 10B closer to the second word line 12B of the first memory cell 10A. The same technique is applicable to the first bit line contact 14A. In this manner, the memory cells 10A and 10B can be downsized vertically, i.e., along the bit lines.

According to the seventh embodiment, each bit line has a two-layer interconnection structure consisting of a lower-level first bit line 15A1 and a higher-level second bit line 15B2. Thus, the space between the memory cells 10A or 10B adjacent to each other horizontally, i.e., along the word lines, can be further shortened. As a result, the memory cells 10A and 10B can be downsized horizontally, too.

Moreover, by adopting the two-layer interconnection structure consisting of the first and second bit lines 15A1 and 15B2, there is no longer any need to secure a margin for a region isolating an adjacent pair of first and second bit lines 15A1 and 15B2 from each other. Thus, a layout can be made while being restricted only by the required minimum width of the active region 11 along the word lines. As a result, the memory cells 10A and 10B can be downsized significantly.

EMBODIMENT 8

Next, an eighth embodiment of the present invention will be described with reference to FIG. 9.

Figure 9:
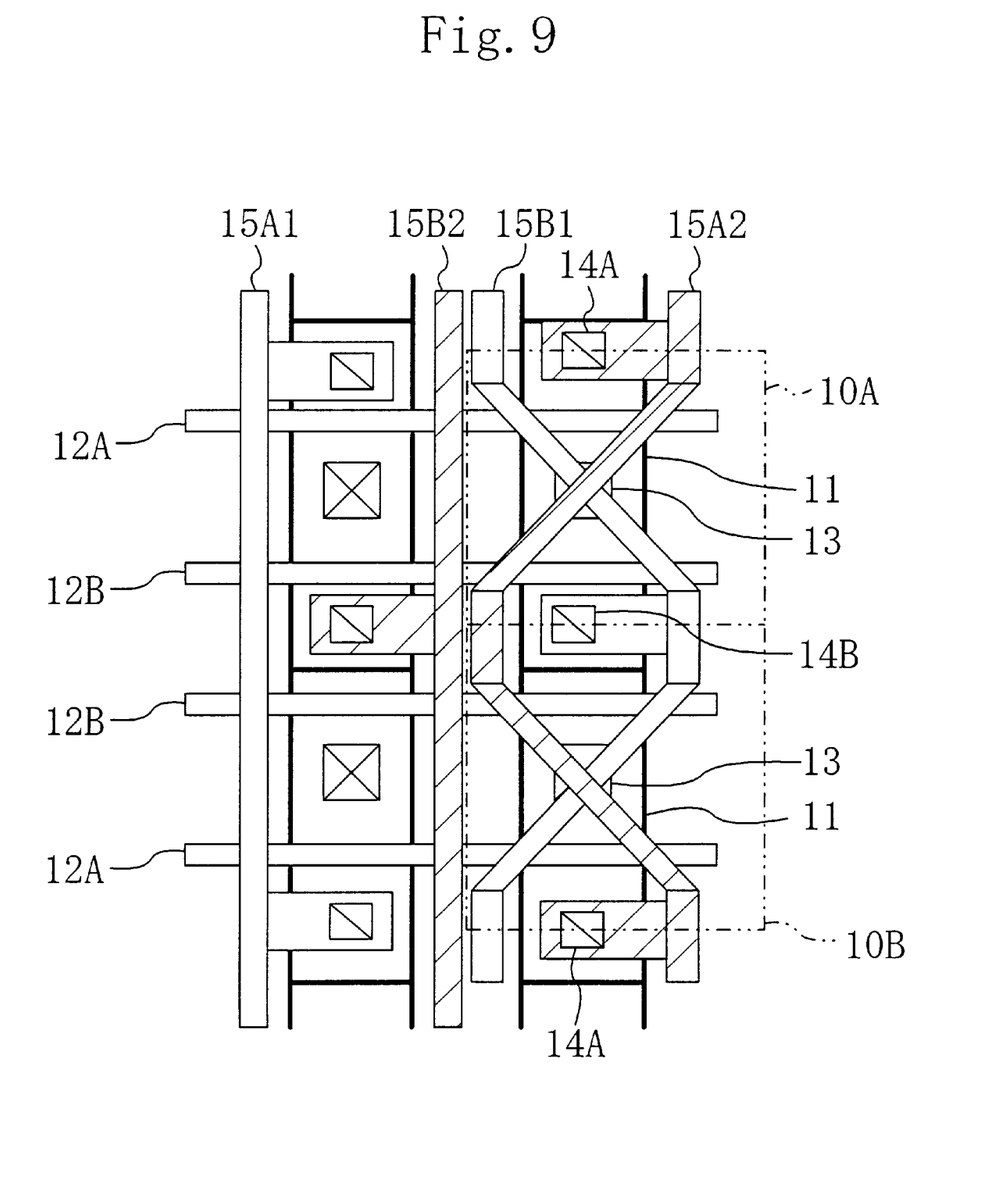
FIG. 9 is a plan view illustrating part of a semiconductor storage device according to an eighth embodiment of the present invention.

FIG. 9 illustrates a partial planar layout for a semiconductor storage device according to the eighth embodiment. In FIG. 9, the same components as those illustrated in FIG. 8 are identified by the same reference numerals and the description thereof will be omitted herein.

As shown in FIG. 9, a lower-level second bit line 15B1 and a higher-level first bit line 15A2 cross each other over the memory cells 10A and 10B.

In such an embodiment, parasitic capacitance between the first and second bit lines 15A2 and 15B1 and the interference noise therebetween can be reduced. As a result, the areas occupied by the memory cells 10A and 10B can be cut down and interference noise between bit lines can be reduced.

In the illustrated embodiment, only one of the two pairs of bit lines are crossed as shown in FIG. 9. Alternatively, these pairs of bit lines may be both crossed, because the interference noise between adjacent bit lines can be further reduced in such a case.

EMBODIMENT 9

Next, a ninth embodiment of the present invention will be described with reference to FIG. 10.

Figure 10:
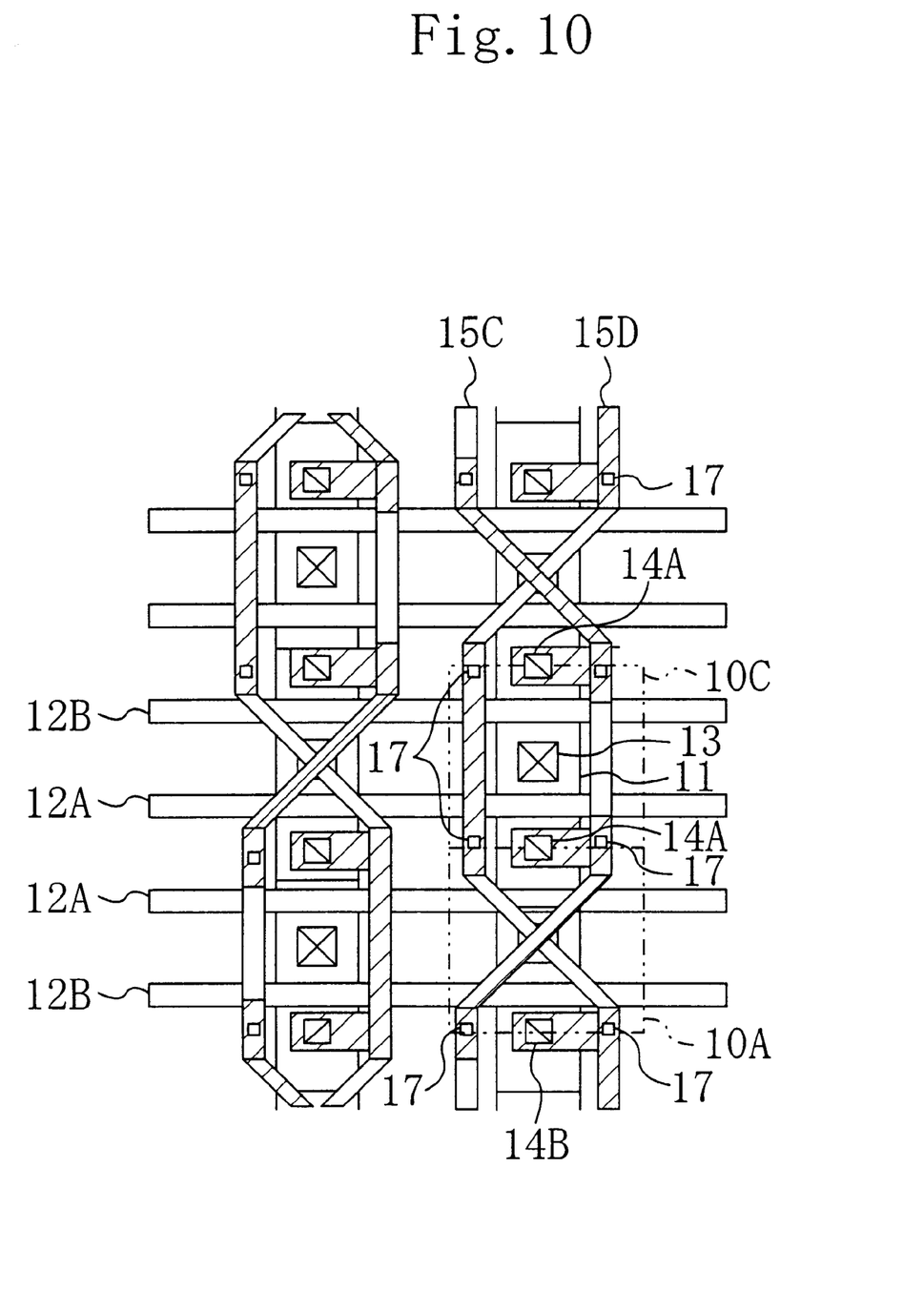
FIG. 10 is a plan view illustrating part of a semiconductor storage device according to a ninth embodiment of the present invention.

FIG. 10 illustrates a partial planar layout for a semiconductor storage device according to the ninth embodiment. In FIG. 10, the same components as those illustrated in FIG. 7 are identified by the same reference numerals and the description thereof will be omitted herein.

According to the ninth embodiment, first and second bit lines 15C and 15D not only cross each other over the memory cells, but also alternately interchange their levels between the memory cells.

As shown in FIG. 10, the first bit line 15C is located at the lower level in a third memory cell 10C with a pair of first bit line contacts 14A. But the first bit line 15C is located at the higher level in a first memory cell 10A adjacent to the third memory cell 10C after having interchanged its levels at an interconnection contact 17. Also, the first bit line 10C crosses the first memory cell 10A diagonally from the upper right corner to the lower left corner thereof.

Similarly, the second bit line 15D is located at the higher level in the third memory cell 10C, but is located at the lower level in the first memory cell 10A adjacent to the third memory cell 10C after having interchanged its levels at another interconnection contact 17. Also, the second bit line 15D intersects with the first bit line 15C over the capacitor contact within the first memory cell 10A.

In such an embodiment, the interference noise between adjacent bit lines can be reduced with more certainty. In addition, the bit lines can be placed uniformly both within planes parallel to the surface of the substrate and within planes vertical thereto in an array of memory cells arranged in columns and rows. That is to say, the material for the bit lines can be distributed evenly. As a result, the performance of the memory cells can be uniformized.

EMBODIMENT 10

Next, a tenth embodiment of the present invention will be described with reference to FIG. 11.

Figure 11:
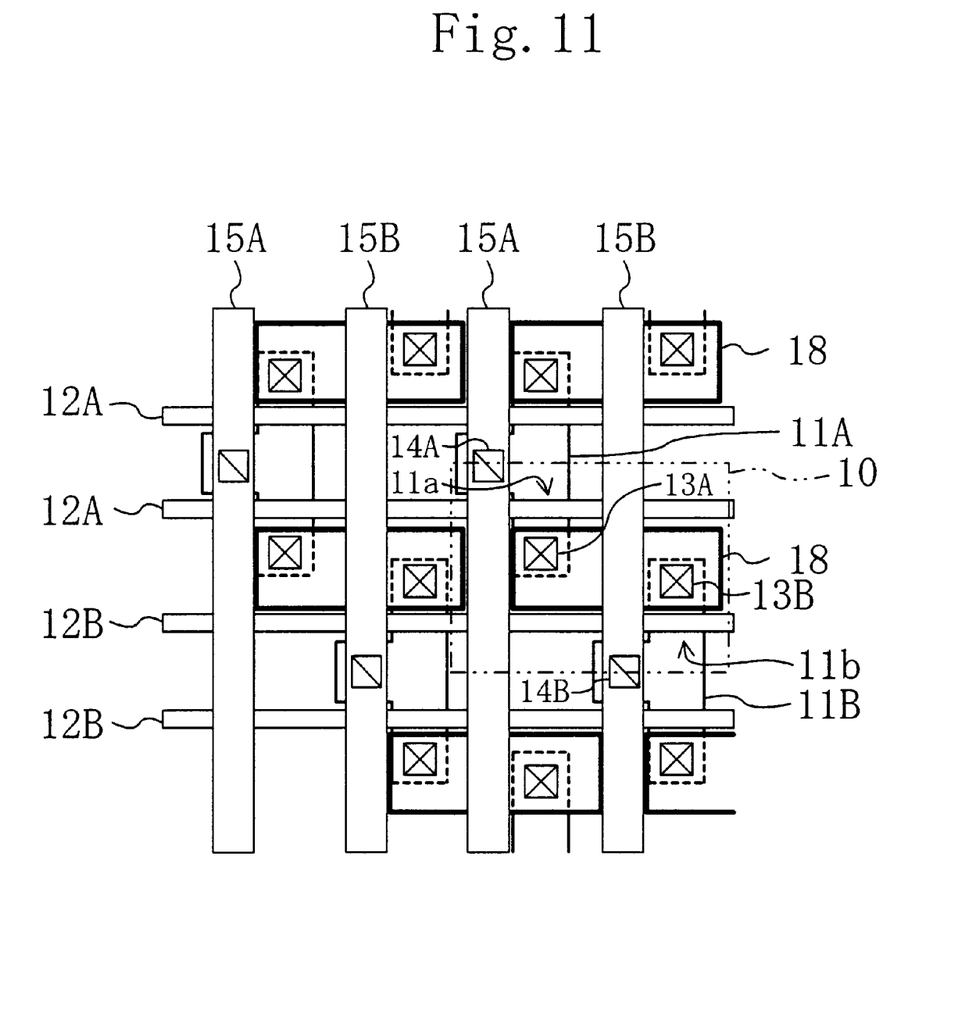
FIG. 11 is a plan view illustrating part of a semiconductor storage device according to a tenth embodiment of the present invention.

FIG. 11 illustrates a partial planar layout for a semiconductor storage device according to the tenth embodiment.

As shown in FIG. 11, first and second active regions 11A and 11B for first and second switching transistors 11$a$ and 11$b$, respectively, are provided within a memory cell 10 over a semiconductor substrate.

Over the first active region 11A, a first word line 12A, a first capacitor (not shown) for storing data thereon, and a first bit line contact 14A are formed. The first word line 12A functions as a gate electrode over the first active region 11A. The first capacitor is formed in a region closer to the center of the memory cell 10 than the first word line 12A is. The first bit line contact 14A is formed in an extended region of the memory cell 10, which is more distant from the center of the memory cell 10 than the first word line 12A is, and is electrically connected to the first active region 11A.

In the same way, a second word line 12B, a second capacitor (not shown) for storing data thereon, and a second bit line contact 14B are formed over the second active region 11B. The second word line 12B functions as a gate electrode over the second active region 11B. The second capacitor is formed in a region closer to the center of the memory cell 10 than the second word line 12B is. The second bit line contact 14B is formed in an extended region of the memory cell 10, which is more distant from the center of the memory cell 10 than the second word line 12B is, and is electrically connected to the second active region 11B.

Over the semiconductor substrate and under the first and second capacitors, a storage node 18 for electrically connecting the first and second active regions 11A and 11B together is formed. On the storage node 18, first and second capacitor contacts 13A and 13B for electrically connecting the storage node 18 to the first and second capacitors, respectively, are formed. That is to say, since the first and second capacitors are electrically connected together via the storage node 18, a single capacitor, which is independently accessible by the first and second switching transistors 11$a$ and 11$b$, is provided.

In this way, the memory cell 10 according to the tenth embodiment is implemented as a two-transistor/one-capacitor memory cell by using the same active regions 11A and 11B as those of the one-transistor/one-capacitor memory cell with the densest structure shown in FIG. 12 and by sharing the storage node 18 of the first and second capacitors formed between the word lines 12A and 12B.

In this embodiment, the conventional fabrication process of a one-transistor/one-capacitor memory cell can be utilized almost as it is, thus considerably cutting down the process cost. That is to say, it is only necessary to replace a storage node mask used for fabricating the conventional one-transistor/one-capacitor memory cell with that of the storage node 18 for the memory cell 10 according to the tenth embodiment. Thus, a two-transistor/one-capacitor memory cell can be fabricated easily with the mask production cost considerably cut down.

According to this embodiment, a semiconductor storage device may also be formed to include not only the two-transistor/one-capacitor memory cells 10, in which the first and second active regions 11A and 11B are arranged like an array and first and second capacitors are shared, but also conventional one-transistor/one-capacitor memory cells in which the first and second capacitors are not shared.

What is claimed is:

1. A semiconductor storage device comprising:
   a plurality of memory cells, each said memory cell including first and second switching transistors and a capacitor, the first and second transistors sharing a portion of an active region on a substrate, the capacitor disposed over the shared portion and having a storage node for storing data thereon;
   a first word line extending over the first switching transistor and functioning as a gate electrode in a first region of the shared portion over the active region in each said memory cell;
   a second word line extending over the second switching transistor and functioning as a gate electrode in a second region of the shared portion over the active region in each said memory cell;
   a capacitor contact disposed between the shared portion and the storage node and electrically connecting the shared portion to the storage node in each said memory cell;
   a first bit line contact disposed over the first switching transistor on the opposite side to the capacitor contact across the first word line and electrically connected to the first region in each said memory cell;
   a second bit line contact disposed over the second switching transistor on the opposite side to the capacitor contact across the second word line and electrically connected to the second region in each said memory cell;
   a first bit line disposed over, and electrically connected to, the first bit line contact and crossing the first and second word lines in each said memory cell; and
   a second bit line disposed over, and electrically connected to, the second bit line contact and crossing the first and second word lines in each said memory cell,
   wherein the first and second bit line contacts are provided substantially symmetrically about the center of each said memory cell, and wherein in two of the memory cells that are adjacent to each other in a direction parallel to the bit lines, one end of the active region in one of the memory cells is continuous with an associated end of the active region in the other memory cell, and
   wherein each of the first and second bit line contacts is shared between the adjacent pair of memory cells.

2. The device of claim 1, wherein each of the first and second word lines has a pair of bent portions, which are located on right and left sides of an intersection between the first or second word line and the first or second bit line.

3. The device of claim 1, wherein each of the gate electrodes of the first and second switching transistors is disposed only in a portion of the active region, which overlaps with either the first or second bit line.

4. The device of claim 1, wherein the active regions of the first and second switching transistors are within a substrate plane crossing the first and second word lines and the first and second bit lines.

5. The device of claim 1, wherein the active regions of the first and second switching transistors are between the first and second bit lines, and
   wherein the device further comprises:
   a first bit auxiliary line disposed between the first bit line and the first bit line contact for electrically connecting the first bit line to the first bit line contact in each said memory cell; and
   a second bit auxiliary line disposed between the second bit line and the second bit line contact for electrically connecting the second bit line to the second bit line contact in each said memory cell.

6. The device of claim 5, wherein in two of the memory cells that are adjacent to each other in a direction parallel to the bit lines, the active region of the first switching transistor in one of the memory cells is continuous with the active region of the first switching transistor in the other memory cell, or the active region of the second switching transistor in one of the memory cells is continuous with the active region of the second switching transistor in the other memory cell, and
   wherein each of the first and second bit line contacts is shared between the adjacent pair of memory cells.

7. The device of claim 5, wherein each of the first and second bit lines includes two interconnection layers stacked one upon the other.

8. The device of claim 7, wherein the two interconnection layers cross each other over the memory cells.

9. The device of claim 8, wherein each of the first and second bit lines includes higher- and lower-level interconnection lines electrically connected to each other via interconnection contacts, and
   wherein the higher- and lower-level interconnection lines alternately interchange their levels between adjacent ones of the memory cells.

10. A semiconductor storage device comprising:
    a first switching transistor disposed in a first active region on a substrate;
    a first word line extending over the first active region and functioning as a gate electrode over the first active region;
    a capacitor for storing data thereon, the capacitor disposed in a first region beside the first word line over the first active region;
    a first bit line contact disposed in a second region beside the first word line over the first active region and electrically connected to the first active region, the second region disposed on the opposite side to the first region across the first word line;
    a second switching transistor formed in a second active region on the substrate, the second active region disposed on the same side as the capacitor beside the first word line and spaced apart from the first active region;
    a second word line disposed over the second active region to be spaced apart from the first word line and functioning as a second gate electrode over the second active region; and a second bit line contact disposed beside the second word line over the second active region and electrically connected to the second active region, the second bit line contact disposed on the opposite side to the capacitor across the second word line, wherein the capacitor includes a storage node for electrically connecting the first and second active region together in a region interposed between the first and second word lines.

11. A semiconductor storage device including a plurality of memory cells, each of the memory cells comprising:

a first switching transistor formed in a first active region on a substrate;

a first word line extending over the first active region and functioning as a gate electrode for the first switching transistor;

a first capacitor contact formed on the first active region within a first region located on one side of the first word line;

a first bit line contact formed on the first active region within a second region located on the opposite side of the first word line to the first region;

a second switching transistor formed in a second active region on the substrate, the second active region being located on the same side of the first word line as the first capacitor contact and being spaced apart from the first active region;

a second word line extending over the second active region in parallel with and spaced apart from the first word line and functioning as a gate electrode for the second switching transistor;

a second capacitor contact formed on the second active region within a third region, the third region being located on one side of the second word line and between the first and second word lines;

a second bit line contact formed on the second active region within a fourth region on the opposite side of the second word line to the third region; and a storage node for a capacitor, the storage node electrically connecting the first and second active regions via the first and second capacitor contacts.

12. The device of claim 11, wherein each of the first and second bit line contacts is shared by two adjacent ones of the plurality of memory cells.

* * * * *